(12) United States Patent
Koyano et al.

(10) Patent No.: US 6,372,411 B1
(45) Date of Patent: Apr. 16, 2002

(54) POLYMER PATTERN FORMING METHOD

(75) Inventors: Takeshi Koyano; Yoshinori Maeno; Juro Mita; Katsuaki Kaifu, all of Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/261,463

(22) Filed: Feb. 24, 1999

(30) Foreign Application Priority Data

Feb. 24, 1998 (JP) .......................................... 10-042167

(51) Int. Cl.$^7$ ................................................ G03F 7/00
(52) U.S. Cl. ...................... 430/321; 430/322; 385/130
(58) Field of Search .............................. 430/322, 323, 430/313, 320, 321; 385/129, 130

(56) References Cited

U.S. PATENT DOCUMENTS

| | | | | | |
|---|---|---|---|---|---|
| 4,096,290 A | * | 6/1978 | Fredericks | .................... | 427/43 |
| 4,339,527 A | * | 7/1982 | Hill | ............................ | 430/322 |
| 4,419,438 A | * | 12/1983 | Etoh et al. | .................. | 430/275 |
| 4,426,247 A | * | 1/1984 | Tamamura et al. | ......... | 156/643 |
| 4,764,247 A | * | 8/1988 | Leveriza et al. | ............. | 156/643 |
| 4,822,721 A | * | 4/1989 | Tsutsumi et al. | ........... | 430/325 |
| 5,166,040 A | * | 11/1992 | Takeda | ....................... | 430/330 |
| 5,776,764 A | * | 7/1998 | Ueta et al. | ................ | 430/270.1 |
| 6,017,680 A | * | 1/2000 | Hattori et al. | .............. | 430/313 |
| 6,259,855 B1 | * | 7/2001 | Lundin | ....................... | 385/146 |

FOREIGN PATENT DOCUMENTS

| | | |
|---|---|---|
| JP | 08044084 | 2/1996 |
| JP | 09304945 | 11/1997 |
| JP | 10097069 | 4/1998 |

* cited by examiner

*Primary Examiner*—Kathleen Duda
(74) *Attorney, Agent, or Firm*—Venable; Ashley J. Wells

(57) ABSTRACT

A polymer pattern forming method including the steps of (a) generating radicals in a pattern forming region of a matrix layer which uniformly contains a radical generating agent, thereby forming a patterned latent image due to the radicals in the pattern forming region; and (b) bringing a monomer which polymerizes by radical polymerization into contact with the matrix layer in which the patterned latent image has been or is being formed, to have the radicals which have been or are being generated induce a chain addition polymerization of the monomer so as to form a polymer pattern on the pattern forming region.

12 Claims, 3 Drawing Sheets

POLYMER PATTERN FORMING METHOD

BACKGROUND OF THE INVENTION

This invention relates to a polymer pattern forming method.

In the communications field, communications networks using light have to be constructed in order to achieve high capacity transmission. The development of interconnection systems and optical wave guide components, and reducing the cost of parts, are therefore matters of major importance.

In the past, glass or inorganic crystalline materials were used in parts such as for example optical wave guide components, however these materials are costly and forming them into a desired shape is difficult.

Therefore, in recent years, polymer materials such as PMMA (polymethylmethacrylate), which are less expensive and easier to work than glass or inorganic crystalline materials, have come to be used instead. If these materials are used, it is possible to form a film-type optical wave guide with greater surface area and excellent flexibility. Also, if functional compounds or functional groups are introduced into these polymer molecules, functional optical wave guides can be engineered.

To manufacture components such as optical wave guides, techniques are required to form the polymer material to a desired pattern. In the prior art, polymer patterns on substrates were mainly formed by reactive ion etching (RIE) using an oxygen plasma.

However, the equipment used for RIE is expensive, and a high level of skill is required to operate it. Also, prior to etching, it is necessary to provide an etching mask corresponding to the pattern on the polymer to be etched by lithography.

To form a polymer pattern using RIE, steps shown schematically in FIG. 3A to FIG. 3E, for example, must be followed. FIG. 3A to FIG. 3E are sectional views showing, in sequence, the main steps involved in forming a polymer pattern by RIE.

First, a polymer film 103 is formed on a substrate 101, and a photoresist film 105 is formed on this polymer film 103 (FIG. 3A). Next, to form this photoresist film 105 so that it can be used as an etching mask corresponding to a desired pattern, photolithography is performed using a photomask 107 corresponding to the pattern (FIG. 3B). A pattern latent image 109 is thereby formed in the photoresist film 105. Part of this pattern latent image is removed by etching (alternatively only part of the pattern latent image may be allowed to remain) so as to form a resist pattern 105x (FIG. 3C). Subsequently, RIE is performed using this resist pattern 105x as an etching mask 105x, to remove the exposed part of the polymer film 103 (FIG. 3D). Finally, the etching mask 105x is removed (FIG. 3E), leaving a polymer film on the substrate 101 forming a polymer pattern 103x. Hence, a large number of steps were involved in the process, and considerable time was required to form the pattern.

A low-cost, simple polymer pattern forming method was therefore desired.

SUMMARY OF THE INVENTION

The inventors of the present invention, by bringing a monomer having radical polymerizing properties into contact with a part generating radicals, were able to addition-polymerize the monomer onto the radical generating part, and thereby arrived at the present invention.

The polymer pattern forming method of this invention comprises a step of generating radicals in a pattern forming region of a matrix layer uniformly containing a radical generating agent, thereby forming a pattern latent image due to the radicals in the pattern forming region, and a step of bringing a radical polymerizing monomer into contact with the matrix layer in which the pattern latent image has been or is being formed, to have these radicals which have been or are being generated induce a chain addition polymerization of the monomer so as to form a polymer pattern in the pattern forming region.

Until now, in the RIE method, the polymer pattern could be formed only by going through a large number of steps using costly equipment. According to this invention however, a pattern latent image due to radicals is formed by exposing an underlying layer, and a radical polymerizing monomer is then brought in contact with the pattern latent image. As the steps to provide an etching mask and then remove the mask are unnecessary, a desired polymer pattern can be formed on a substrate in far fewer steps than in the prior art, consequently, there is no need for any expensive equipment and the polymer pattern can be formed with ease.

Preferably, the radicals are generated by radiation. This radiation may be in the form of electromagnetic waves of any wavelength including light and electron beams, but must have sufficient energy to convert a radical generating agent to radicals. Here, it is convenient to irradiate the pattern forming region by light. This light may for example be ultraviolet radiation. The radical generating agent used in this invention can be converted to radicals using light of wavelength 280 nm–500 nm. Preferably, the light should not have a wavelength of less than 280 nm or more than 450 nm so as not to destroy a matrix layer. Areas of the matrix layer containing the radical generating agent other than the region in which the pattern is to be formed (pattern forming region) are covered by a photomask, the radical generating agent in the pattern forming region is converted to radicals by exposure to light, and a pattern latent image is formed by the radicals. A radical polymerizing monomer is then brought in contact with the matrix layer in which the pattern latent image has been formed to induce addition polymerization of the monomer, and a polymer pattern matching the pattern latent image is thus easily formed.

The radical polymerizing monomer may be brought into contact with the matrix layer at the same time as the generation of the radicals. In this case, the generation of the radicals by for example radiation, and the addition polymerization of the monomer by the contact of the radical polymerizing monomer with the matrix layer take place concurrently.

It is also preferable that the matrix layer is formed by mixing a material having radical polymerizing properties with a radical polymerizing agent, the latter being present in greater amount than is required to polymerize the material, and to polymerize the material using part of the radical generating agent.

According to this invention, to form the polymer pattern on the matrix layer, the matrix layer must contain a radical polymerizing agent. For this purpose, a material having radical polymerizing properties and an excess amount of a radical polymerizing agent are used for the matrix layer. First, after mixing the materials together, the matrix layer is exposed to light to generate radicals, and the material having radical polymerizing properties is polymerized. A hard matrix layer is thereby obtained. As the amount of radical generating agent used is greater than the amount required to harden the material having radical polymerizing properties, some radical polymerizing agent which has not been converted into radicals remains in the hardened matrix layer. The matrix layer is therefore made to contain radical generating agent. When a mask corresponding to the pattern is provided on the matrix layer and the matrix layer is exposed to light, the radical generating agent in the matrix layer which is exposed through the mask is converted to radicals, and due to these radicals, a pattern latent image is easily formed.

DETAILED DESCRIPTION OF THE INVENTION

Figure 1A:
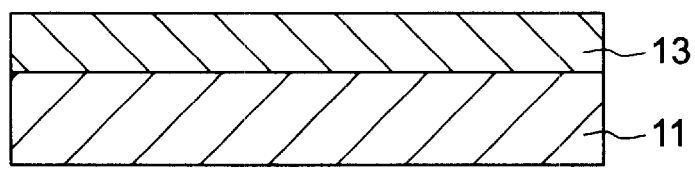
FIG. 1A and FIG. 1B are sectional views showing the steps in a method of polymer pattern formation according to an embodiment of the invention.

A preferred embodiment of the polymer pattern forming method according to this invention will now be described referring to the drawings. It should be noted that the shape, size and positional relationships of constituent components in the drawings are shown schematically in only sufficient detail for the purposes of describing the invention, and should not be construed as limiting the invention in any way.

Figure 1B:
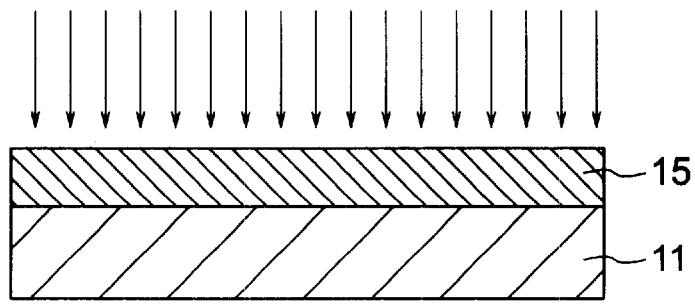

1. A matrix layer uniformly containing a radical generating agent is formed by the following process which will be described in outline (FIG. 1A and FIG. 1B). FIG. 1A and FIG. 1B are schematic sectional views of the steps involved in forming the polymer pattern used in this example of the invention.

First, the radical generating agent and polymer material for forming the matrix are mixed and dissolved to form a matrix solution. This matrix solution 13 is applied to a substrate 11 (FIG. 1A), and solidified to form a matrix layer 15 (FIG. 1B).

Specifically, the matrix solution 13 is solidified by the following process. The polymer material for forming the matrix is a material which undergoes radical polymerization. A greater amount of the radical polymerizing agent than is required to polymerize the polymer material is mixed with the polymer material to form the matrix solution. This matrix solution 13 is then applied to the substrate 11 (FIG. 1A), and the coated substrate is exposed to light, adjusting the amount of light exposure to convert to radicals a sufficient amount of radical generating agent required to polymerize the polymer material. The generated radicals induce radical polymerization of the matrix-forming polymer material in the matrix solution 13. As a result, the matrix solution 13 becomes a solidified matrix layer 15 (FIG. 1B). At this point, the remaining radical generating agent which was not converted to radicals is uniformly distributed throughout the matrix layer 15.

Alternatively, the radical generating agent may be mixed with a solution of a polymer material which solidifies on drying, and the hard matrix layer may be formed by coating this solution on the substrate and drying it. In this case, there is no need for the matrix solution to contain an excess of the radical generating agent. Specifically, it need contain only the amount of radical generating agent required to polymerize the radical polymerizing monomer in the pattern forming region of the matrix layer.

Figure 2A:
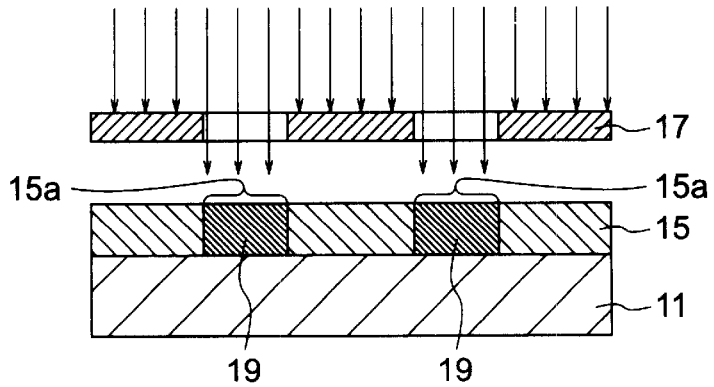
FIG. 2A to 2C are sectional views showing the steps in a method of polymer pattern formation performed subsequent to the steps shown in FIG. 1A and FIG. 1B.
Figure 2B:
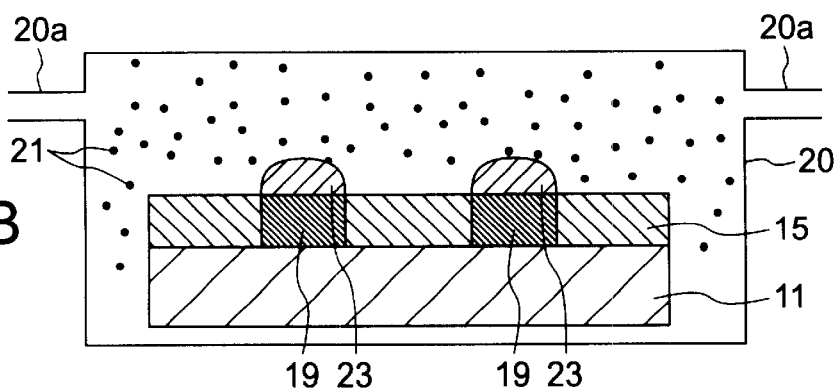
Figure 2C:
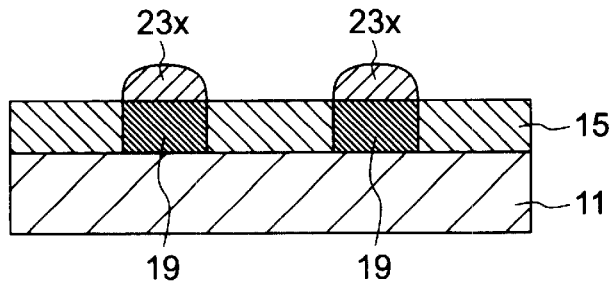
Figure 3A:
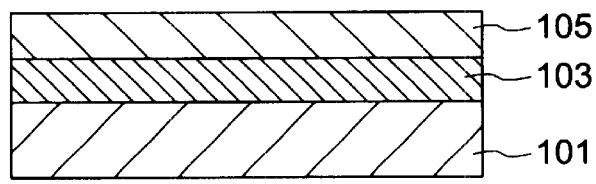
FIG. 3A to 3E are sectional views showing the steps in a conventional method of polymer pattern formation.
Figure 3B:
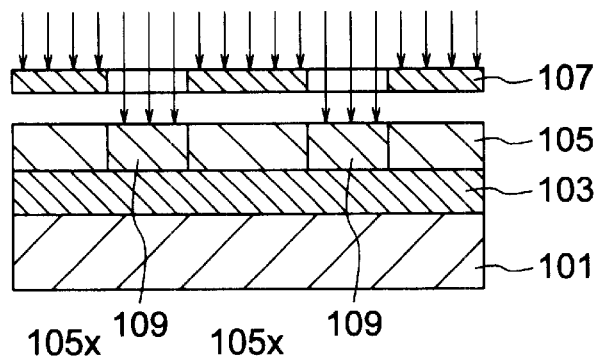
Figure 3C:
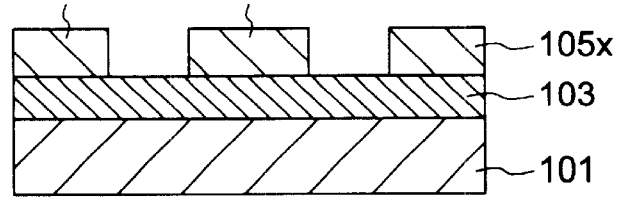
Figure 3D:
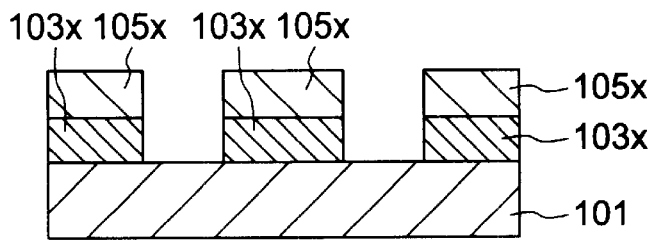
Figure 3E:
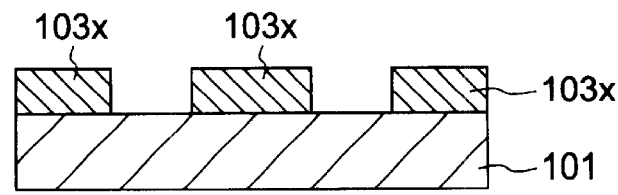

2. Next, radicals are generated in the pattern forming region of the matrix layer, and a pattern latent image is formed due to the radicals (FIG. 2A to FIG. 2C). FIG. 2A to FIG. 2C are drawings showing the polymer pattern-forming steps after FIG. 1A and FIG. 1B.

Specifically, a photomask 17 having a predetermined pattern shape is arranged on the upper side of the matrix layer 15 (on the opposite side to the substrate). A high-energy radiation such as ultraviolet light is irradiated from above the photomask 17, causing radicals to be generated in a matrix layer 15a exposed to light through the photomask 17. As this region 15a in which radicals are generated matches the pattern, a pattern latent image 19 is formed by the radicals in the matrix layer 15 (FIG. 2A).

3. Next, a polymer pattern is formed on the pattern latent image by bringing a radical polymerizing monomer into contact with the matrix layer having the pattern latent image.

One method of bringing the radical polymerizing monomer into contact with the matrix layer is for example to generate a vapor 21 of the monomer, and leave the matrix layer 15 having the pattern latent image 19 in an atmosphere of the vapor 21 for a given time. The vapor 21 of the monomer undergoes a polymerization reaction on the pattern latent image 19, and a polymer 23 grows in this part of the layer 15 (FIG. 2B).

This enables a pattern 23x of the polymer 23 to be formed on the matrix layer 15 (FIG. 2C).

In the above embodiment, the step of bringing the radical polymerizing monomer into contact with the matrix layer is performed after the step of generating radicals to form the pattern latent image in the matrix layer. Alternatively, these two steps may be carried out concurrently. In this case, the generation of the radicals by for example radiation, and the addition polymerization of the monomer by the contact of the radical polymerizing monomer with the matrix layer take place concurrently.

EXAMPLES

Next, the method of forming the polymer pattern according to this invention will be described in more detail by means of specific examples. It should however be understood that conditions such as amounts of reagents, processing temperatures, processing times and the reagents used in the following description are given only by way of example within the scope of the invention.

First, a matrix layer uniformly containing a radical generating agent is formed.

In this example, 0.0765 g of 2,2-dimethyl-2-phenylacetophenone (Aldrich Inc.) was added as radical generating agent to 10 g of trimethylolpropanetriacrylate (commercial name TMP-A, Ryueisha Yushi Kagaku Kogyo), and the compounds were thoroughly mixed and dissolved by stirring at room temperature in a sealed container for 2 hours in the dark. This solution was then filtered. The filter was a PTFE (polytetrafluoroethylene) film having a pore diameter of 0.45 $\mu$m. As a result of filtration, impurities and undissolved substances in the solution are removed so that a uniform film can be obtained in subsequent steps. The resulting solution was used as an experimental matrix solution.

Next, this matrix solution 13 was spin-coated at a rotation speed of 3000 rpm on a silicon wafer 11 (FIG. 1A). As the radical generating agent (2,2-dimethyl-2-phenylacetophenone) in the matrix solution 13 is converted to radicals by light of wavelength 330 nm, the spin coating was performed using a safety light from which wavelengths of 450 nm or less had been cut. Subsequently, the matrix solution 13 on the silicon wafer 11 was irradiated by light of wavelength 330 nm (ultraviolet light) in a nitrogen atmosphere to convert the 2,2-dimethyl-2-phenylacetophenone to radicals. The trimethylolpropanetriacrylate was made to undergo addition polymerization due to these radicals, thereby forming a hard film-like matrix layer 15 of thickness 2 μm (FIG. 1B). The ultraviolet light irradiation was continued for a time sufficient to generate the radicals required to solidify the matrix solution 13 and form the matrix layer 15. The matrix solution 13 contained at least 10 times the amount of radical generating agent required to form the matrix layer 15, and consequently, radical generating agent which had not been converted to radicals remained in the solidified matrix layer 15.

Next, radicals were generated in the pattern forming region of the matrix layer so as to form a pattern latent image due to the radicals.

In this example, a photomask 17 having a 20 μm line-and-space pattern was arranged on the upper surface of the matrix layer 15 in a nitrogen atmosphere. Subsequently, the matrix layer 15 was irradiated by light of wavelength 330 nm from above the photomask 17. As a result, radicals were selectively generated (2,2-dimethyl-2-phenylacetophenone, which is the radical generating agent, was converted to radicals) in a region 15a (pattern-forming region) of the matrix layer 15 which was exposed through the photomask 17. A pattern latent image 19 due to radicals was thereby formed in the region 15a where the radicals were generated (FIG. 2A). Conversion to radicals of the radical generating agent should take place to an extent sufficient to polymerize the radical polymerizing monomer along the pattern shape in the pattern forming region 15a. Therefore, the part formed by radical conversion in the vicinity of the surface of the pattern forming region 15a of the matrix layer 15 is referred to as the pattern latent image, and the whole region which is converted to radicals in the direction of the thickness of the matrix layer 15, as shown in FIG. 2A is also referred to as the pattern latent image.

Next, a polymer is grown on the pattern latent image by bringing a radical polymerizing monomer in contact with the matrix layer having the pattern latent image.

For this purpose, in the present example, the silicon wafer 11 and the matrix layer 15 in which the pattern latent image 19 was formed, was placed in a container 20 which could be sealed from the outside and which contained a nitrogen atmosphere. Methyl methacrylate vapor 21 was led into the container 20 from a gas inlet 20a, and the matrix layer 15 was exposed to this atmosphere for 1 hour. This methyl methacrylate vapor 21 was produced for example as follows. Liquid methyl methacrylate was placed in a flask, and the flask was heated to approximately 50° C. The methyl methacrylate vapor generated in the flask was cooled by passing through a cooling tube, and the vapor leaving the cooling tube at a temperature below room temperature was led into the container 20 containing a nitrogen atmosphere. In this way, there was no risk that the methyl methacrylate vapor 21 would cool and condense in the nitrogen atmosphere. The radicals generated in the pattern latent image 19 cause the radical polymerizing methyl methacrylate 21 to undergo addition polymerization, and polymethyl methacrylate 23 is formed which grows on the pattern latent image 19 (FIG. 2B).

When the polymethyl methacrylate pattern 23x formed on the matrix layer 15 was examined with an electron microscope, it was confirmed that a polymethylmethacrylate pattern 23x having a height of approximately 1 μm had been formed along the approximately 20 μm line-and-space pattern (FIG. 2C).

In this example, trimethylolpropanetriacrylate was used as the matrix-forming polymer material, but the invention is not limited to this substance, and any material having a glass transition temperature of 100° C. or more which can be homogeneously mixed with a radical polymerizing agent, and which can be applied by spin coating on a substrate, may be used. For example, polyfunctional acrylates such as pentaerythritoltriacrylate, pentaerythritoltetracrylate and dipentaerythritolhexacrylate can be used. These polyfunctional acrylates may be used as the matrix layer by polymerizing in the same way as in the above example. Polymers such as polycarbonates, polyurethanes, polyacrylates and polyacrylonitrile may also be used. When these polymers are used, it is convenient to mix the radical polymerizing agent with a solution of the polymer, apply the mixture to a substrate and dry it to form the matrix layer.

In this example, 2,2-dimethyl-2-phenylacetophenone was used as the radical generating agent, but the invention is not limited to this substance, and any substance which is converted to radicals by light may be used. For example, diazo compounds or titanocene chloride, benzil, 1-(4-isopropylphenyl)-2-hydroxy-2-methylpropan-1-one, 2-hydroxy-2-methyl-1-phenylpropan-1-one, azoisobutylnitrile or the like may be used.

In this example, methyl methacrylate was used as the monomer which undergoes addition polymerization, but the invention is not limited to this substance, and acrylonitrile, methyl acrylate, or the like may also be used.

When the polymer pattern formed on the matrix layer is to be used for optical components such as optical wave guides, the monomer which forms the material of the polymer pattern should be chosen to have a higher refractive index than that of the matrix-forming polymer material.

In the above example, the step of bringing the radical polymerizing monomer into contact with the matrix layer is performed after the step of generating radicals to form the pattern latent image in the matrix layer. Alternatively, these two steps may be carried out concurrently. In this case, the generation of the radicals by for example radiation, and the addition polymerization of the monomer by the contact of the radical polymerizing monomer with the matrix layer take place concurrently.

ADVANTAGES OF THE INVENTION

As is clear from the above description, according to the polymer pattern forming method of this invention, radicals are first selectively generated in a pattern forming region of a matrix layer in which a radical generating agent is uniformly distributed, to form a pattern latent image due to the radicals, a monomer which undergoes addition polymerization induced by radicals is brought in contact with this matrix layer having the pattern latent image so that the radicals cause the monomer to undergo a chain addition polymerization, and a polymer pattern is thereby formed on the pattern latent image.

In comparison with the conventional method of forming a polymer pattern using RIE, the method of this invention enables such a pattern to be formed without requiring costly equipment or advanced operating techniques, and steps for providing an etching mask and removing the mask after completing RIE are moreover unnecessary. A desired polymer pattern can therefore be formed with fewer steps, and the polymer pattern can be formed economically and simply.

What is claimed:

1. A polymer pattern forming method comprising the steps of:
   (a) generating radicals in a pattern forming region of a matrix layer uniformly containing a radical generating agent, thereby forming a pattern latent image due to said radicals in said pattern forming region; and
   (b) bringing a radical polymerizing monomer into contact with said matrix layer in which said pattern latent image has been or is being formed, to have the radicals which have been or are being generated induce a chain addition polymerization of the radical polymerizing monomer so as to form a polymer pattern extending upwardly from said pattern forming region, said polymer pattern being formed on said matrix layer.

2. The polymer pattern forming method as defined in claim 1, wherein said radicals are generated by irradiating said pattern forming region with light having a wavelength ranging from 280 to 500 nm.

3. The polymer pattern forming method as defined in claim 2, wherein said light is ultraviolet radiation.

4. The polymer pattern forming method as defined in claim 1, wherein said step of forming said pattern latent image comprises:
   providing a mask corresponding to said pattern above said matrix layer, and
   performing exposure of said matrix layer from above said mask.

5. The polymer pattern forming method as defined in claim 1, wherein said matrix layer is formed by:
   mixing a material having radical polymerizing properties with a radical polymerizing agent, said agent being present in an amount which exceeds that required to polymerize said material; and
   polymerizing said material using part of said radical generating agent.

6. The polymer pattern forming method as defined in claim 1, wherein said step (b) is performed after said step (a), whereby said radical polymerizing monomer is brought into contact with said matrix layer in which said pattern latent image has been formed, to have the radicals which have been generated induce a chain addition polymerization of the radical polymerizing monomer so as to form a polymer pattern on said pattern forming region.

7. A method of forming a pattern of optical wave guides, comprising the steps of:
   (a) generating radicals in a pattern forming region of a matrix layer uniformly containing a radical generating agent so that a pattern latent image is formed due to said radicals in said pattern forming region; and
   (b) bringing a radical polymerizing monomer into contact with said matrix layer in which said pattern latent image has been or is being formed, to have the radicals which have been or are being generated induce a chain addition polymerization of the radical polymerizing monomer so as to form a polymer pattern extending upwardly from said pattern forming region, said polymer pattern being formed on said matrix layer, so that said polymer pattern is said pattern of optical wave guides.

8. The method as defined in claim 7, wherein said radicals are generated by irradiating said pattern forming region with light having a wavelength ranging from 280 to 500 nm.

9. The method as defined in claim 8, wherein said light is ultraviolet radiation.

10. The method as defined in claim 7, wherein forming the pattern latent image comprises:
    providing a mask corresponding to said pattern above said matrix layer; and
    performing exposure of said matrix layer from above said mask.

11. The method as defined in claim 7, wherein said matrix layer is formed by:
    mixing a material having radical polymerizing properties with a radical polymerizing agent, said agent being present in an amount which exceeds that required to polymerize said material; and
    polymerizing said material using part of said radical generating agent.

12. The method as defined in claim 7, wherein step. (b) is performed after step (a), so that said radical polymerizing monomer is brought into contact with said matrix layer in which said pattern latent image has been formed, to have the radicals which have been generated induce a chain addition polymerization of the radical polymerizing monomer so as to form a polymer pattern on said pattern forming region.

* * * * *